(12) United States Patent
Johnson (10) Patent No.: US 9,054,672 B2
(45) Date of Patent: Jun. 9, 2015

(54) SELECTIVE VARIABLE ATTENUATION CIRCUITRY AND ASSOCIATED METHODS

(75) Inventor: Michael S. Johnson, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 466 days.

(21) Appl. No.: 13/466,735

(22) Filed: May 8, 2012

(65) Prior Publication Data

US 2013/0300523 A1    Nov. 14, 2013

(51) Int. Cl.
*H01P 1/22*    (2006.01)
*H03H 7/24*    (2006.01)

(52) U.S. Cl.
CPC ... *H03H 7/24* (2013.01); *H01P 1/22* (2013.01)

(58) Field of Classification Search
CPC .................................. H03H 7/24; H01P 1/22
USPC ........................... 333/81 A, 81 R, 32, 33, 17.3
See application file for complete search history.

(56) References Cited

U.S. PATENT DOCUMENTS

| | | | | |
|---|---|---|---|---|
| 5,095,471 A | * | 3/1992 | Sidman | 369/43 |
| 7,639,100 B2 | * | 12/2009 | Fuentes | 333/81 R |
| 2007/0247256 A1 | * | 10/2007 | Rostami et al. | 333/81 R |
| 2013/0069737 A1 | * | 3/2013 | See et al. | 333/32 |

OTHER PUBLICATIONS

Intersil, "ISL95311 VCOM Applications", AN183.0, May 10, 2005, 2 pg.

* cited by examiner

*Primary Examiner* — Stephen E Jones
(74) *Attorney, Agent, or Firm* — Egan, Peterman & Enders LLP.

(57) ABSTRACT

Variable capacitive attenuation circuitry and associated methods are disclosed that may be implemented to employ a plurality of multi-purpose capacitors that may be selectably coupled together in different configurations to form a capacitive divider having different respective attenuation properties. In a particular embodiment, each of the capacitors of the disclosed capacitive attenuation circuitry may be selectably coupled to an RF reference as either a shunt capacitor or coupled in series between an RF signal input and an attenuated RF signal output as a series capacitor, thus forming a capacitive divider having selected attenuation properties. The disclosed variable capacitive attenuation circuitry may be advantageously utilized to attenuate an input RF signal and to provide a resulting attenuated RF output signal, for example, in the front end of RF receiver circuitry.

20 Claims, 7 Drawing Sheets

SELECTIVE VARIABLE ATTENUATION CIRCUITRY AND ASSOCIATED METHODS

FIELD OF THE INVENTION

This disclosure generally relates to attenuation, and more particularly to systems and methods that provide for variable attenuation.

BACKGROUND OF THE INVENTION

Figure 1:
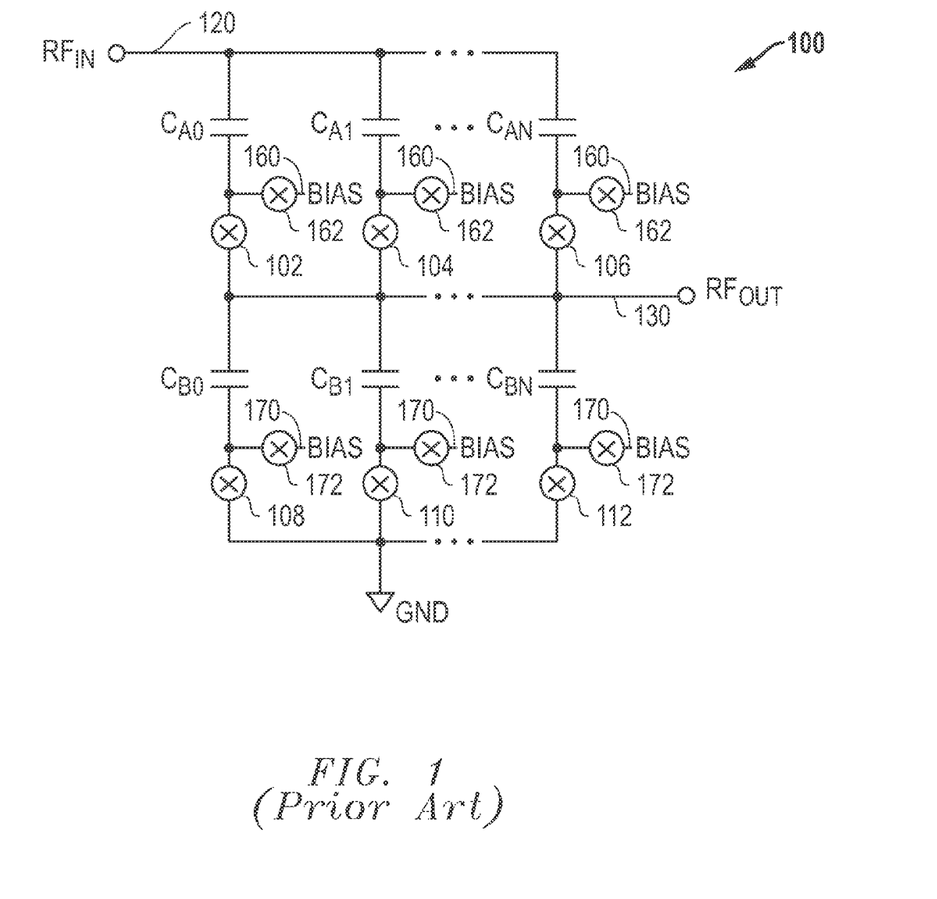
FIG. 1 illustrates conventional variable capacitive attenuation circuitry.

Capacitive attenuation circuitry is commonly found in the front-end of radio frequency (RF) receivers for purposes of attenuating an input RF signal. FIG. 1 illustrates conventional variable capacitive attenuation circuitry 100 that employs multiple series capacitors $C_{A0}$ and $C_{A1}$-$C_{AN}$ that are coupled together in parallel between an RF signal input 120 and an attenuated RF signal output 130, and that also employs multiple shunt capacitors $C_{B0}$ and $C_{B1}$-$C_{BN}$ that are coupled together in parallel between series capacitors $C_{A0}$ and $C_{A1}$-$C_{AN}$ and ground. Together, the series capacitor/s $C_A$ and shunt capacitor/s $C_B$ that are active in the circuit 100 at any given time act to form a capacitive divider that attenuates an incoming RF signal applied to RF signal input 120. In some cases, series capacitors $C_A$ and/or capacitors $C_B$ may be optionally binary weighted.

As shown in FIG. 1, each of series capacitors $C_{A0}$ and $C_{A1}$-$C_{AN}$ can be removed from the in-line signal path between RF signal input 120 and attenuated RF signal output 130 by using a respective control signal (not shown) to cause opening of a respective MOS transistor switch 102, 104 or 106 so that the removed series capacitor floats, while a switch 162 is closed to apply a voltage bias 160 to each floating series capacitor to reduce nonlinearity. Similarly, each of shunt capacitors $C_{B0}$ and $C_{B1}$-$C_{BN}$ can be isolated from ground by using a respective control signal (not shown) to cause opening of a respective MOS transistor switch 108, 110 or 112 so that the isolated shunt capacitor floats, while a switch 172 is closed to apply a voltage bias 170 to each floating shunt capacitor to reduce nonlinearity. In this manner, the amount of attenuation between RF signal input 120 and attenuated RF signal output 130 can be varied by changing the combination of capacitors $C_{A0}$ and $C_{A1}$-$C_{AN}$ that are coupled in the signal path between RF signal input 120 and attenuated RF signal output 130, and by changing the combination of capacitors $C_{B0}$ and $C_{B1}$-$C_{BN}$ that are coupled to ground. In particular, variable capacitive attenuation circuitry 100 acts as a capacitive divider that attenuates an incoming RF signal applied to RF signal input 120 by an amount that is equal to the selected series capacitance divided by the sum of the selected series capacitance and the selected shunt capacitance that is coupled to ground at any given time.

SUMMARY OF THE INVENTION

Disclosed herein is variable capacitive attenuation circuitry and associated methods that may be implemented to employ a plurality of multi-purpose or multi-role capacitors that may be selectably coupled together in different configurations to form a capacitive divider having different respective attenuation properties. In this regard, each of the capacitors of the disclosed variable capacitive attenuation circuitry may be selectably coupled to an RF reference (e.g., ground or alternatively a DC voltage) as either a shunt capacitor or coupled in series between an RF signal input and an attenuated RF signal output as a series capacitor, thus forming a capacitive divider having selected attenuation properties. Because each of the capacitors may serve different roles (i.e., either as a shunt capacitor or as an in-line series capacitor of the capacitive divider), the total number of required capacitors for the disclosed capacitive attenuation circuitry may be reduced in one embodiment as compared to the total number of capacitors required by conventional capacitive attenuation circuitry, such as illustrated in FIG. 1, thus translating into circuit area savings.

In one exemplary embodiment, the disclosed capacitive attenuation circuitry may be advantageously utilized to attenuate an input RF signal and to provide a resulting attenuated RF output signal in any application where such signal attenuation is useful or desired including, but not limited to, in the front end of RF receiver circuitry. Examples of such receivers include long-wave, medium-wave, and/or short-wave RF receivers; AM and/or FM RF receivers; digital audio broadcasting (DAB) receivers, etc. and receivers that are configured to receive and process two or more of such RF bands. In such and embodiment, the disclosed capacitive attenuation circuitry may be implemented, for example, in both the low magnitude high frequency (LMHF) and very high frequency (VHF) signal paths.

In one exemplary embodiment, the disclosed capacitive attenuation circuitry may be configured as a capacitive divider having multiple capacitor elements, each of which may be coupled either as a shunt capacitor to an RF reference or may be coupled as series capacitor within the in-line signal path between an RF signal input and an attenuated RF signal output of the capacitive attenuation circuitry so that none of the capacitors is ever allowed to float when an RF input signal is present, i.e., none of the capacitors may ever be placed in a condition where it is not either coupled to an RF reference or coupled in the signal path in series between the RF signal input and the attenuated RF signal output of the capacitive attenuation circuitry. Moreover, no voltage bias ever need to be applied to any of the capacitors to reduce nonlinearity since in this embodiment none of the switch nodes are ever allowed to float during operation. This advantageously reduces circuit complexity and eliminates the need for a bias voltage and corresponding switches to control the application of same to bias/"off" or floating nodes.

In the above embodiment, parasitic capacitance may be reduced or substantially eliminated at the $RF_{OUT}$ node 230, since each capacitor is either always coupled to an RF reference or coupled in-line between the RF signal input and the attenuated RF signal output. This is in contrast to the separate dedicated shunt capacitors of the conventional capacitive attenuation circuitry, which float when they are not coupled to an RF reference and thus exhibit increased parasitic capacitance, and therefore the disclosed capacitive attenuation circuitry may be configured in one embodiment to exhibit loss improvement over conventional circuitry designs. In this regard, when no signal attenuation is desired, all capacitors of the capacitive attenuation circuitry may be selectably switched to be in series between the RF signal input and RF signal output so as to produce a non-attenuated RF signal at the signal output that exhibits substantially no signal loss as compared to the RF signal provided at the RF signal input of the capacitive attenuation circuitry. However, it will be understood that in another embodiment, it is alternatively possible to implement the disclosed capacitive attenuation circuitry in a manner such that it is possible to selectably place one or more of the capacitors in a floating condition while an RF input signal is present, i.e., where one or more of the capacitors is neither coupled to an RF reference nor coupled in the signal path in series between the RF signal input and the attenuated RF signal output of the capacitive attenuation circuitry.

In one exemplary embodiment, the disclosed capacitive attenuation circuitry may also be configured to efficiently multiplex two or more different RF input signals for attenuation. In such a multiplexed embodiment, the number of capacitors required for achieving a given attenuation of multiple signal inputs may be advantageously reduced as compared to conventional multiplexing configurations, since additional capacitors are not required for each additional input. This characteristic results in further circuit area savings over conventional designs.

In one respect, disclosed herein is variable capacitive attenuation circuitry having at least one RF signal input and an RF signal output, and including at least two capacitors. Each of the capacitors of the circuitry may be selectable within the circuitry as either a shunt capacitor between the RF signal output and an RF reference, or as a series capacitor between the RF signal input and the RF signal output.

In another respect, disclosed herein is a method for attenuation of RF signals, including: providing variable capacitive attenuation circuitry including at least one RF signal input, at least two capacitors and an RF signal output, each of the capacitors of the circuitry being selectable within the circuitry as either a shunt capacitor between the RF signal output and an RF reference or as a series capacitor between the RF signal input and the RF signal output; receiving an RF input signal at the RF signal input of the variable capacitive attenuation circuitry; and controlling the production of an RF output signal from the RF input signal by selecting each of the capacitors as either a shunt capacitor between the RF signal output and the RF reference, or as a series capacitor between the RF signal input and the RF signal output.

DESCRIPTION OF ILLUSTRATIVE EMBODIMENTS

Figure 2:
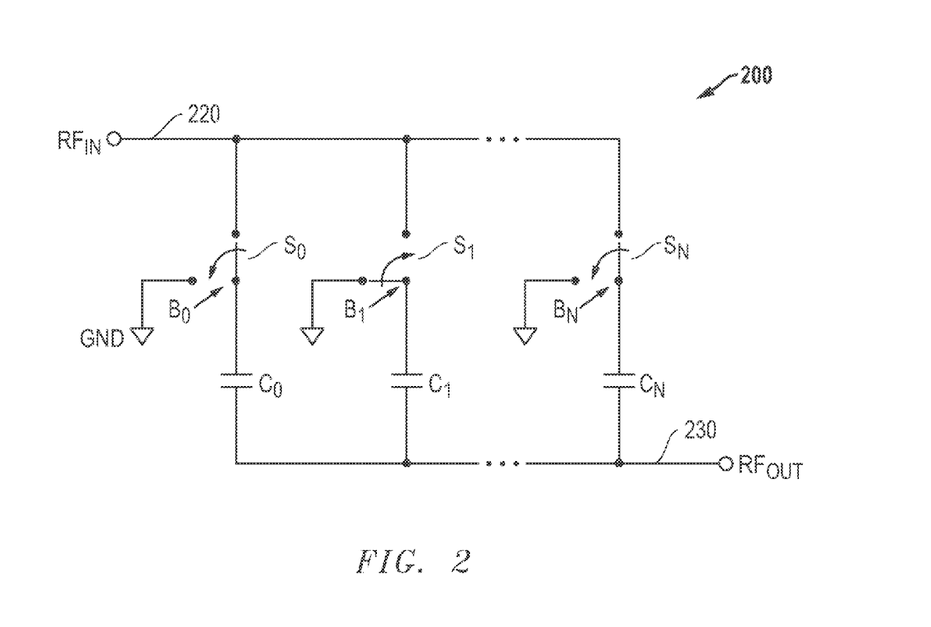
FIG. 2 illustrates variable capacitive attenuation circuitry according to one exemplary embodiment of the disclosed systems and methods.

FIG. 2 illustrates one exemplary of variable capacitive attenuation circuitry 200 having an RF signal input 220 and an attenuated RF signal output 230. In this embodiment, circuitry 200 includes a plurality of two or more capacitors $C_0$ and $C_1$-$C_N$ that are each coupled between the RF signal output and a respective one of switching circuits $S_0$ or $S_1$-$S_N$ that are provided to form switching circuitry of capacitive attenuation circuitry 200. It will be understood that as used herein a "capacitor" may include a circuit element that provides capacitance to the circuit or that acts as a capacitor during circuit operations, or any combination of multiple circuit elements that together provide capacitance to the circuit or that together act as a capacitor during circuit operations. Moreover, each of switching circuits $S_0$ and $S_1$-$S_N$ may be implemented using any suitable switch circuit device or combination of switch circuit devices, e.g., such as PMOS and/or NMOS transistors.

Besides capacitors, it will be understood that it is also possible to implement the disclosed variable attenuation circuitry using voltage divider architectures that include types of impedance elements other than capacitors, e.g., such as resistors, inductors, etc. It will also be understood that it is possible to implement the disclosed variable attenuation circuitry with combinations of types of impedance elements, e.g., such as using a resistor/capacitor voltage divider having a series resistor and shunt capacitor, vice versa, or other mixed element configurations.

Still referring to the illustrated embodiment of FIG. 2, each of switching circuits $S_0$ and $S_1$-$S_N$ is also coupled between a respective one of capacitors $C_0$ and $C_1$-$C_N$ and RF signal input 220, and is also coupled between an RF reference (e.g., AC ground as illustrated in FIG. 2 or alternatively may be a DC bias voltage) and the same respective one of capacitors $C_0$ or $C_1$-$C_N$. In this embodiment, each of switching circuits $S_0$ and $S_1$-$S_N$ is controllable by at least one respective control bit $B_0$ or $B_1$-$B_N$ to selectably connect one of capacitors $C_0$ and $C_1$-$C_N$ to either one of RF signal input 220 or to the RF reference. As described further below, an amount of attenuation applied to an RF input signal provided to RF signal input 220 before output at RF signal output 230 may be controlled (e.g., by using control bits $B_0$ or $B_1$-$B_N$) to control settings of switching circuits $S_0$ and $S_1$-$S_N$.

Figure 3:
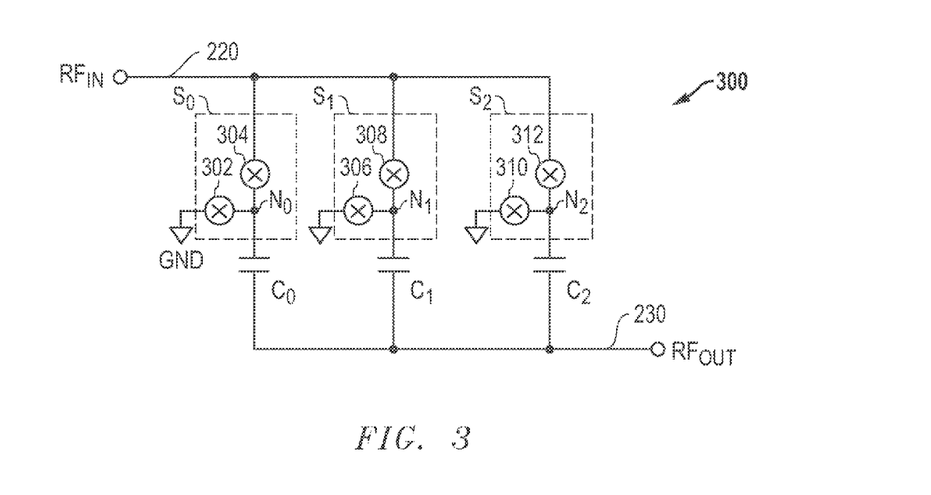
FIG. 3 illustrates variable capacitive attenuation circuitry according to one exemplary embodiment of the disclosed systems and methods.

FIG. 3 illustrates one exemplary 3-bit embodiment of variable capacitive attenuation circuitry 300 that employs three capacitors $C_0$, $C_1$, and $C_2$ configured according to the circuit architecture of FIG. 2. In this embodiment switching circuits $S_0$ and $S_1$-$S_N$ are each implemented using two switches (e.g., MOSFET transistors or other suitable switch devices), although any other number of switches or configuration thereof may be employed that is suitable for implementing the switching tasks of switching circuits S as described herein. The capacitance values of each of capacitors $C_0$, $C_1$, and $C_2$ may be of any value selected to yield desired signal attenuation by circuitry 300, e.g., capacitance values of $C_0$, $C_1$, and $C_2$ may be binary weighted relative to each other, may be of equal relative to each other, may be unequal and non-binary weighted relative to each other, or may be any combination thereof.

As shown in FIG. 3, in this embodiment switching circuit $S_0$ includes first and second switches 304 and 302, respectively, with first switch 302 being coupled between RF signal input 220 and a first node $N_0$, and with second switch 302 being coupled between the RF reference and first node $N_0$. As further shown, a corresponding capacitor $C_0$ is coupled between RF signal output 230 and first node $N_0$. In a first setting of switching circuit $S_0$, first switch 304 may be selectably controlled to close to connect RF signal input 220 to capacitor $C_0$ at the same time that second switch 302 is controlled to open to isolate RF signal input 220 and capacitor $C_0$ from the RF reference. In a second setting of switching circuit $S_0$, first switch 304 may be selectably controlled to open to isolate RF signal input 220 from capacitor $C_0$ at the same time that second switch 302 is controlled to close to connect capacitor $C_0$ to the RF reference. Thus, switching circuit $S_0$ may be controlled in this embodiment so that capacitor $C_0$ is never isolated and is always connected either to the RF reference or in series between RF signal input 220 and RF signal output 230. It will be understood that the operation of each of the other switching circuits $S_1$ and $S_2$ (and their respective switch pairs 308/306 and 312/310) relative to a corresponding one of capacitor $C_1$, and $C_2$ is the same as described for switching circuit $S_0$. It will also be understood that capacitive attenuation circuitry having more than three capacitors may be implemented in a similar manner using additional capacitors C and additional corresponding switching circuits S.

In the embodiment of FIG. 3, inverse control of switch pairs 304 and 302 (as well as switch pairs 308/306 and 312/310) may be implemented by separately controlling switches 304 and 302 using separate control signals, or may be implemented using a single control signal to which control switches 304 and 302 react in inverse manner relative to each other, i.e., one switch opens when the other switch closes and vice-versa in response to the same control signal. In one example of the latter, switches 304 and 302 may be different respective types of MOSFET transistors (PMOS and NMOS) that respond in opposite fashion to a given control signal voltage, such that MOSFET switch 302 turns on and MOSFET switch 304 turns off in response to the same control signal, and vice-versa.

Figure 4:
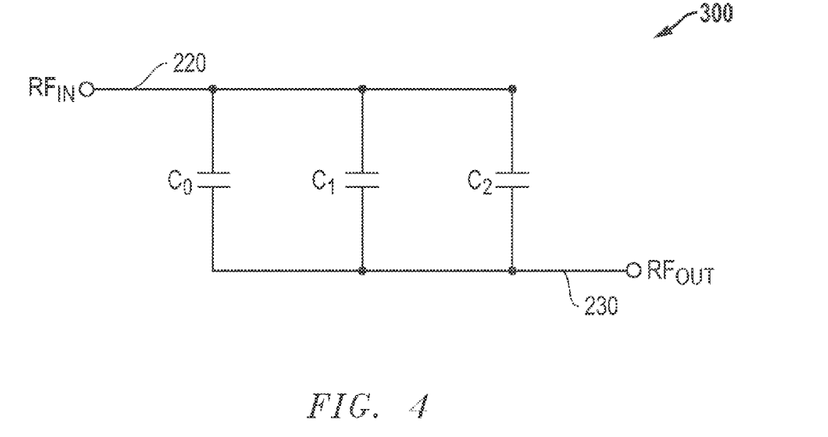
FIG. 4 illustrate one examples of an equivalent circuitry configuration that may be implemented by variable capacitive attenuation circuitry of FIG. 3 according to one exemplary embodiment of the disclosed systems and methods.
Figure 5:
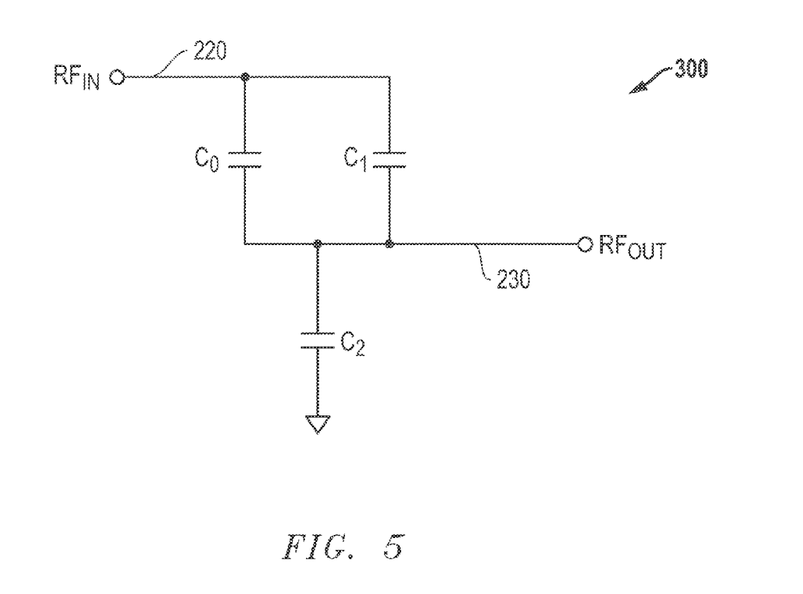
FIG. 5 illustrate one examples of an equivalent circuitry configuration that may be implemented by variable capacitive attenuation circuitry of FIG. 3 according to one exemplary embodiment of the disclosed systems and methods.
Figure 6:
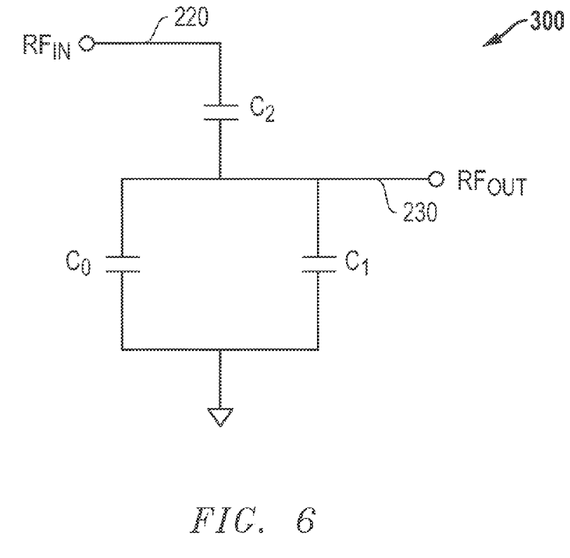
FIG. 6 illustrate one examples of an equivalent circuitry configuration that may be implemented by variable capacitive attenuation circuitry of FIG. 3 according to one exemplary embodiment of the disclosed systems and methods.

FIGS. 4-6 illustrate examples of the different equivalent circuitry configurations (illustrated without the presence of switching circuits $S_0$, $S_1$ and $S_2$) that may be implemented by selectably controlling switching circuits $S_0$, $S_1$ and $S_2$ of 3-bit variable capacitive attenuation circuitry 300 of FIG. 3 to be in different states. For example, FIG. 4 illustrates a selectable configuration for variable capacitive attenuation circuitry 300 that imparts substantially no relative attenuation (0 dB) to an RF input signal received at RF signal input 220 so as to produce a substantially non-attenuated RF output signal at RF signal output 230. The particular configuration of FIG. 4 may be achieved by controlling each of switching circuits $S_0$, $S_1$ and $S_2$ such that each of capacitors $C_0$, $C_1$ and $C_2$ is isolated from the RF reference and connected in series between RF signal input 220 and RF signal output 230.

FIG. 5 illustrates another selectable configuration for variable capacitive attenuation circuitry 300 that may be implemented to impart a relative attenuation of about −1.3 dB to an RF input signal received at RF signal input 220 to produce an attenuated RF signal for output at RF signal output 230, in an example that employs optional binary weighting of the capacitance value of capacitors $C_0$, $C_1$ and $C_2$ (i.e., with relative capacitance values of $C_0=2C_1=4C_2$). The particular configuration of FIG. 5 may be achieved by controlling each of switching circuits $S_0$, $S_1$ and $S_2$ such that each of capacitors $C_0$ and $C_1$ are isolated from the RF reference and connected in series between RF signal input 220 and RF signal output 230, and such that capacitor $C_2$ is coupled as a shunt capacitor between RF output 230 and the RF reference.

FIG. 6 illustrates yet another selectable configuration for variable capacitive attenuation circuitry 300 that may be implemented to impart a relative attenuation of about −16.9 dB to an RF input signal received at RF signal input 220 to produce an attenuated RF signal for output at RF signal output 230, where capacitors $C_0$, $C_1$ and $C_2$ are optionally binary weighted. The particular configuration of FIG. 6 may be achieved by controlling each of switching circuits $S_0$, $S_1$ and $S_2$ such that capacitor $C_2$ is isolated from the RF reference and connected in series between RF signal input 220 and RF signal output 230, and such that capacitors $C_0$ and $C_2$ are coupled as shunt capacitors between RF output 230 and the RF reference.

It will be understood that the particular illustrated embodiments of FIGS. 3-6 are exemplary only, and that any number of capacitors greater than three, and of any desired relative capacitance values, may be similarly employed and selectably controlled by respective switching circuits to impart a selected desired attenuation to an RF input signal. For example, Table 1 lists three exemplary relative capacitor weightings (binary, equal, and other weightings) for an exemplary embodiment of variable capacitive attenuation circuitry having five capacitors $C_1$-$C_5$, it being understood that any other value of relative capacitor weightings may be employed for any number of multiple capacitors. Using the values of Table 1, maximum attenuation may be achieved by selecting only the capacitor with the smallest capacitance value as a series capacitor and selecting the remaining four capacitors as shunt capacitors. Alternatively, no attenuation may be achieved by selecting all of the five capacitors as series capacitors with none of the capacitors selected as shunt capacitors. No signal conduction through the variable capacitive attenuation circuitry may be achieved by selecting all of the five capacitors as shunt capacitors with none of the capacitors selected as series capacitors.

TABLE 1

Example Relative Capacitor Weightings

| Capacitor | Binary Weighting | Equal Weighting | Other Weighting |
| --- | --- | --- | --- |
| $C_1$ | 0.65 pF | 4.03 pF | 1.38 pF |
| $C_2$ | 1.3 pF | 4.03 pF | 2.02 pF |
| $C_3$ | 2.6 pF | 4.03 pF | 3.58 pF |
| $C_4$ | 5.2 pF | 4.03 pF | 6.37 pF |
| $C_5$ | 10.4 pF | 4.03 pF | 6.80 pF |

Figure 7:
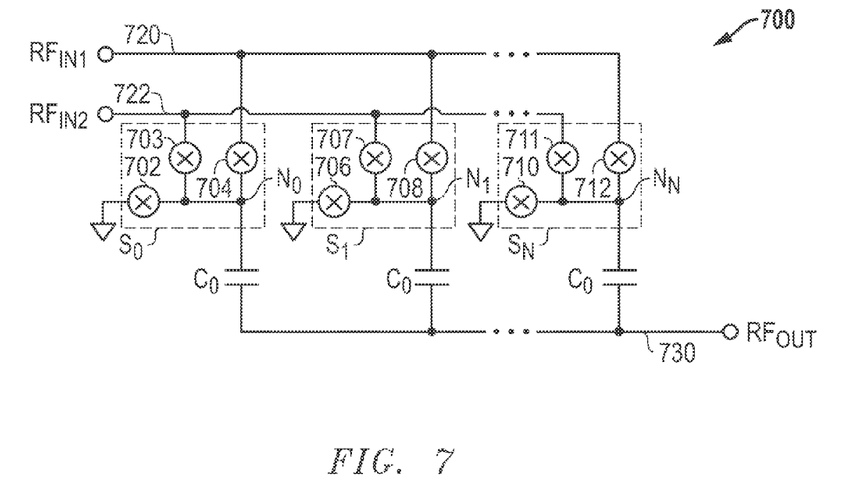
FIG. 7 illustrates variable capacitive attenuation circuitry according to one exemplary embodiment of the disclosed systems and methods.

FIG. 7 illustrates another exemplary embodiment of a multi-bit variable capacitive attenuation circuitry 700 that is configured to provide for both variable attenuation and multiplexing of multiple different RF input signals applied to multiple RF signal inputs 720 and 722 so as to provide an attenuated RF output signal 730 based on at least one of the different RF signal inputs 720 and 722. As shown, this embodiment employs multiple capacitors $C_0$ and $C_1$-$C_N$ that are each selectably controlled by a respective one of switching circuits $S_0$ and $S_1$-$S_N$. In this exemplary embodiment, switching circuit $S_0$ includes a first switch 704 coupled between RF signal input 720 and a first node $N_0$, a second switch 703 coupled between RF signal input 722 and first node $N_0$, and with a third switch 702 coupled between the RF reference and first node $N_0$. As further shown, a corresponding capacitor $C_0$ is coupled between RF signal output 230 and first node $N_0$. A similar architecture may be employed as shown for each of the other switching circuits $S_1$-$S_N$.

Still referring to FIG. 7, first RF signal input 720 may be selected to the exclusion of second RF signal input 722 for input to circuitry 700 by selectably opening the second switches of each of switching circuits switching circuits $S_0$ and $S_1$-$S_N$ (i.e., each of second switch 703 of switching circuit $S_0$, second switch 707 of switching circuit $S_1$, and second switch 711 of switching circuit $S_N$) in order to selectively isolate second RF signal input 722 from each of capacitors $C_0$ and $C_1$-$C_N$, while at the same time selectably closing the first switch of at least one of switching circuits $S_0$ and $S_1$-$S_N$ (i.e., at least one of first switch 704 of switching circuit $S_0$, first switch 708 of switching circuit $S_1$, or first switch 712 of switching circuit $S_N$) in order to connect at least one of capacitors $C_0$ and $C_1$-$C_N$ in series between first RF signal input 720 and RF signal output 730. In such a case, the relative amount of attenuation (or no attenuation) for RF signal input 720 may be selected in a manner as previously described in relation to circuitry 300 of FIG. 3 by controlling opening or closing of the third switches of each of the remaining switching circuits $S_0$ and $S_1$-$S_N$ (i.e., third switch 702 of switching circuit $S_0$, third switch 706 of switching circuit $S_1$, and/or third switch 710 of switching circuit $S_N$) in inverse manner to the selected setting of the second switch of each of the corresponding same switching circuits $S_0$ and $S_1$-$S_N$.

In the above-described manner, first RF input signal 720 may selected for input to circuitry 700 to the exclusion of second RF input signal 722, and different amounts of attenuation (or no attenuation) may be selected for first RF input signal 720 by varying the setting of individual switches of switching circuits $S_0$ and $S_1$-$S_N$ to achieve different equivalent circuitry configurations (e.g., such as illustrated in FIGS. 4-6) by selectably connecting at least one the capacitors $C_0$ and $C_1$-$C_N$ in series between first RF signal input 720 and RF signal output 730 and by optionally connecting one or more of the remaining capacitors as shunt capacitors between RF output 730 and the RF reference.

In like manner, second RF signal input 722 may be selected to the exclusion of first RF signal input 720 for input to circuitry 700 by selectably opening the third switches of each of switching circuits switching circuits $S_0$ and $S_1$-$S_N$ in order to isolate first RF signal input 720 from each of capacitors $C_0$ and $C_1$-$C_N$, while at the same time closing the second switch of at least one of switching circuits $S_0$ and $S_1$-$S_N$ in order to connect at least one of capacitors $C_0$ and $C_1$-$C_N$ in series between second RF signal input 722 and RF signal output 730. Further, different amounts of attenuation (or no attenuation) may be selected for second RF signal input 722 by varying the setting of individual switches of remaining switching circuits $S_0$ and $S_1$-$S_N$ to achieve different equivalent circuitry configurations as described above.

In one exemplary embodiment where a different RF band is received at each different RF signal input of capacitive attenuation circuitry, a different signal attenuation value may be selected for use with each different received RF band by varying the coupled capacitive divider configuration of the capacitors within the variable attenuation circuitry. This may be implemented, for example, by storing pre-defined switching circuit settings for each different RF band in a lookup table stored within read-only memory (ROM), and then accessing the lookup table in ROM to determine the desired new switching circuit settings when changing from one RF band to another different RF band, e.g., such as when changing from a first RF band received at RF signal input 720 to a second and different RF band received at RF signal input 722 in the exemplary embodiment of FIG. 7. In such a case, the settings of switching circuits $S_0$ and $S_1$-$S_N$ may be changed in real time according to the settings retrieved from the lookup table.

It will be understood that the embodiment of FIG. 7 is exemplary only, and that more than two RF input signals may be multiplexed in similar manner by employing additional switches within switching circuits $S_0$ and $S_1$-$S_N$ that are configured to selectably isolate each additional RF signal input from each of capacitors $C_0$ and $C_1$-$C_N$. Moreover, it will also be understood that it in some cases, two or more different RF input signals may be optionally blended for input at the same time into variable attenuation circuitry 700, e.g., by simultaneously closing a first switch of at least one of switching circuits $S_0$ and $S_1$-$S_N$ and a second switch of at least one of switching circuits $S_0$ and $S_1$-$S_N$ so as to simultaneously connect at least one of capacitors $C_0$ and $C_1$-$C_N$ in series between first RF signal input 720 and RF signal output 730 and at least one of capacitors $C_0$ and $C_1$-$C_N$ in series between second RF signal input 720 and RF signal output 730.

Figure 8:
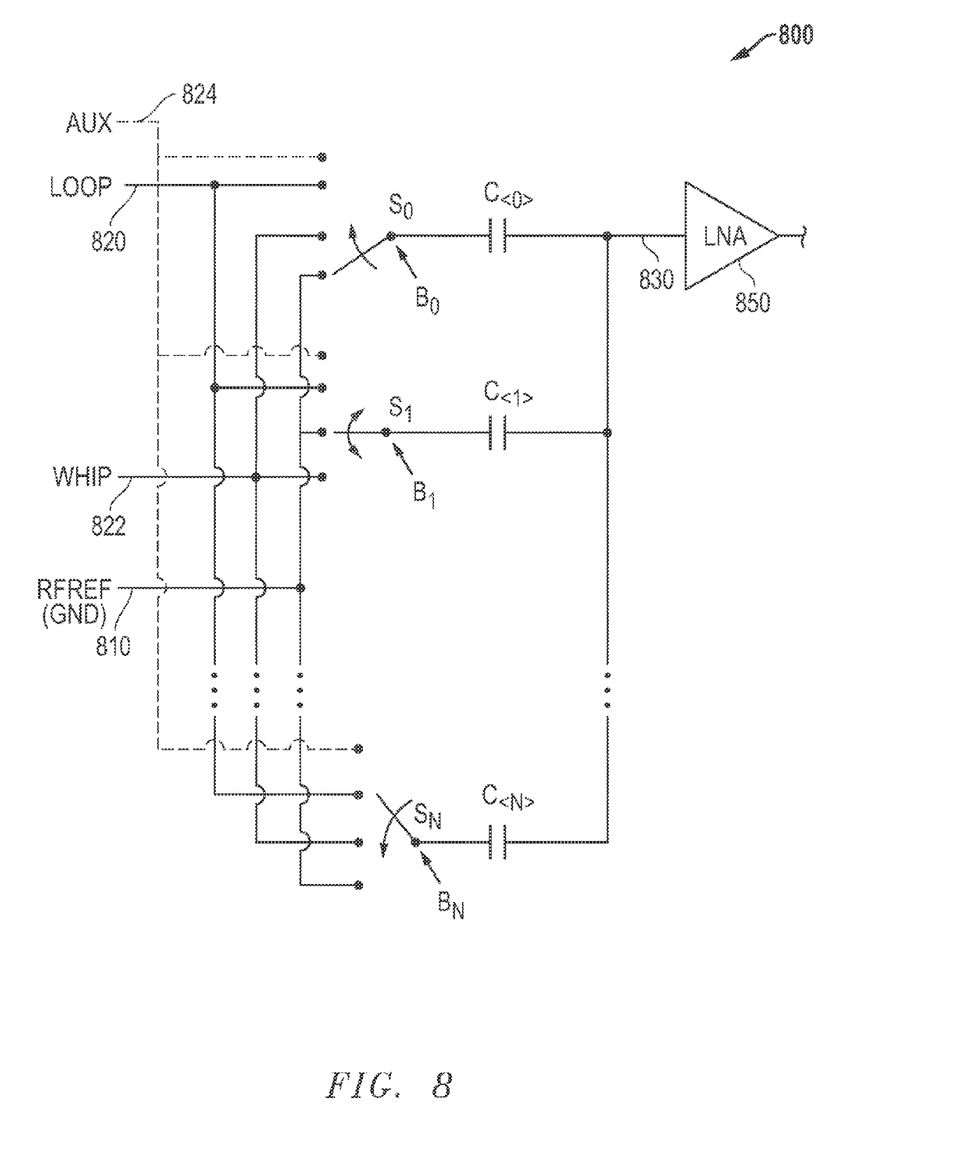
FIG. 8 illustrates variable capacitive attenuation circuitry according to one exemplary embodiment of the disclosed systems and methods.

FIG. 8 illustrates another exemplary embodiment of a two-bit variable capacitive attenuation circuitry 800 having an attenuated RF signal output 830 and at least two RF input signals 820 and 822 that are multiplexed. As an example implementation, first RF signal input 820 is provided as an input for a loop antenna signal (LOOP), and second RF signal input 822 is provided as an input for a whip antenna signal (WHIP). An RF reference (RFREF) terminal 810 is provided in the illustrated embodiment for connection to an RF reference. As shown in dashed lines, it is possible that more than two RF inputs may be multiplexed in similar manner by adding additional signal lines and switching capacity (e.g., by adding additional switch terminals, switch devices, etc.). In this case, an optional third RF signal input 824 is shown provided as an input for an auxiliary (AUX) RF signal, it being understood that more than three RF input signals may be multiplexed in similar fashion. An optional low noise amplifier (LNA) 850 is also shown in this exemplary embodiment as it may be coupled to receive the attenuated RF signal output of circuitry 800. It will be understood that the particular identity and configuration of RF input signals and LNA 850 is exemplary only, and that provision for other types of input signals and output components may be alternatively employed. Other examples include, but are not limited to, multiple directional antennas multiplexed to a coupled LNA.

Still referring to the exemplary embodiment of FIG. 8, variable attenuation circuitry 800 includes a plurality of three or more capacitors $C_0$ and $C_1$-$C_N$ that are each coupled in series between the RF signal output and a respective one of switching circuits $S_0$ or $S_1$-$S_N$ in a manner as previously described herein. Each of switching circuits $S_0$ and $S_1$-$S_N$ may be implemented and controlled (e.g., by using control bits $B_0$ or $B_1$-$B_N$) in a manner as previously described herein to select and attenuate at least one of RF input signals 820, 822, 824, etc. In this embodiment, capacitors $C_0$ and $C_1$-$C_N$ may be characterized as operating on a "hinge", with the hinge node being the input to the LNA 850. Each of switching circuits $S_0$ or $S_1$-$S_N$ of this embodiment may be thought of acting equivalent to a single-pole triple-throw switch with its respective capacitor in series with the pole.

Figure 9:
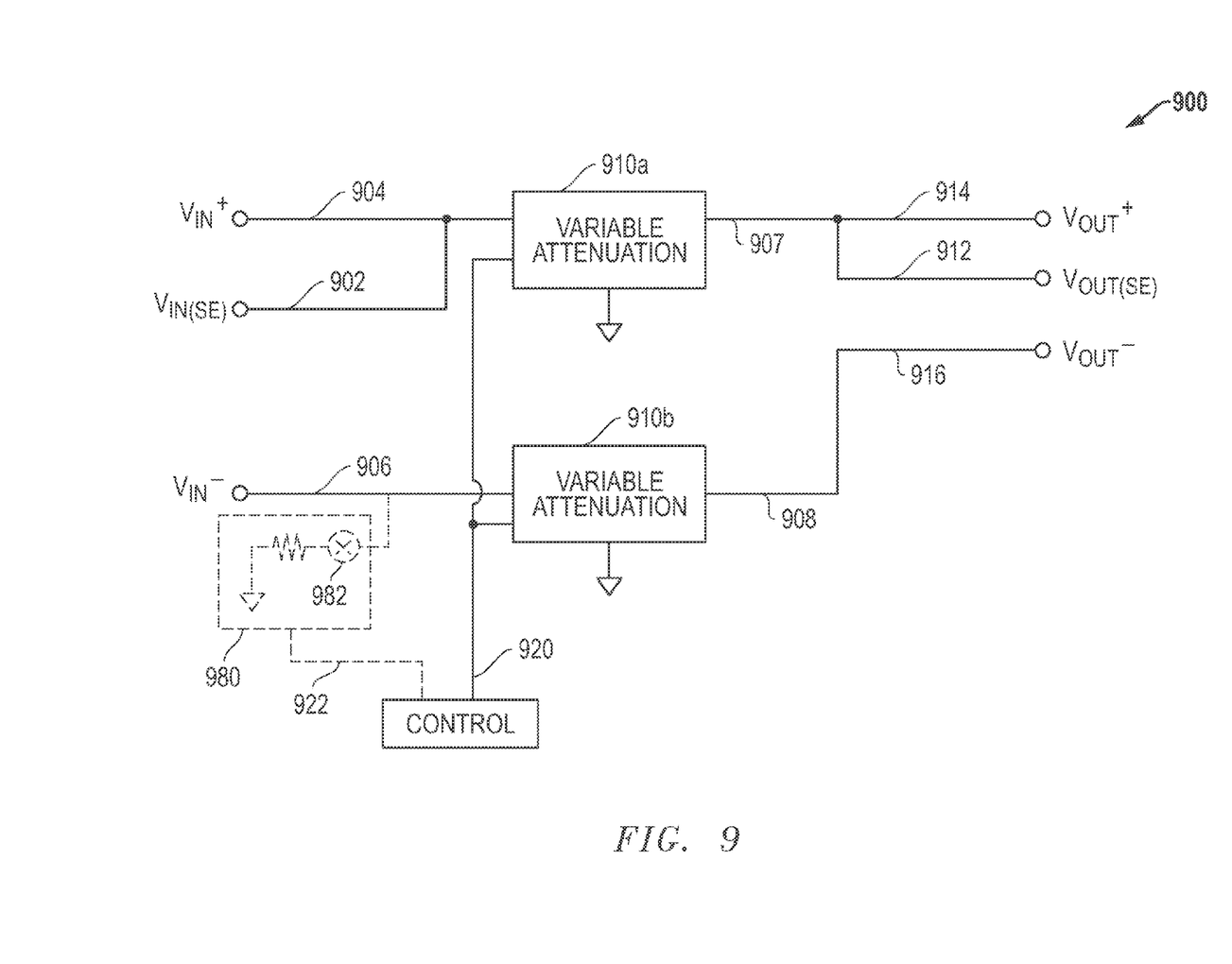
FIG. 9 illustrates variable capacitive attenuation circuitry according to one exemplary embodiment of the disclosed systems and methods.

FIG. 9 illustrates one exemplary embodiment of dual-input mode variable signal attenuation circuitry 900 as it may be configured to allow for alternative connection to receive and attenuate either a single-ended (SE) input signal or a differential input signal. As shown, circuitry 900 includes two substantially identical variable capacitive attenuation circuits 910a and 910b. Each of variable attenuation capacitive attenuation circuits 910a and 910b may be individually configured, for example, in a manner as illustrated and described in relation to FIGS. 2-8. As shown, differential RF signal inputs 904 and 906 are provided for coupling to receive a differential RF input signal pair, while single-ended RF signal input 902 is provided for alternatively coupling to receive a single-ended RF input signal.

When operating in differential mode, each of variable capacitive attenuation circuitries 910a and 910b of circuitry 900 may be simultaneously controlled to attenuate each half of the RF differential signal pair received at inputs 904 and 906 by a substantially identical amount to produce an attenuated differential RF signal pair having attenuated signal halves 907 and 908. The attenuated signal pair 907 and 908 may be provided as shown at respective attenuated differential RF signal outputs 914 and 916. Simultaneous control of variable capacitive attenuation circuitries 910a and 910b may be provided by a control signal 920 as shown, or by separate control signals if desired or needed. When operating in single-ended mode, a single-ended RF input signal may be provided only to variable capacitive attenuation circuitry 910a, which is controlled to attenuate the single-ended signal received at input 902 to produce an attenuated single-ended signal at single-ended RF signal output 912.

As further shown in dashed outline, for single-ended operation dual-input mode variable signal attenuation circuitry 900 may be optionally further configured for providing a single-ended RF signal to an LNA (or other circuitry requiring a ground or RF reference input) at output 912, and for selectably providing a simultaneous RF reference signal to the LNA at output 916. This mode of operation may be accomplished by using control signal 922 to selectably connect RF reference input circuitry 980 to an RF reference such as ground or a DC bias voltage (e.g., by closing switch 982 or using other suitable method), and by simultaneously controlling variable capacitive attenuation circuit 910b (e.g., in a manner previously described in relation to FIG. 4) to produce no attenuation of the RF reference input signal that is provided at output 916. It will also be understood that RF reference input circuitry 980 may be alternatively integrated within variable attenuation circuitry 910b, e.g., coupled as a selectable multiplexed alternative to differential half input 906. This may be configured, for example, by using multiplex circuitry similar to that illustrated in FIG. 7, but by coupling the resistor of RF reference input circuitry between an RF reference and input 722 of the circuitry of FIG. 7 (e.g., instead of coupling input 722 to a second RF input signal $RF_{IN2}$ as is illustrated in FIG. 7).

Figure 10:
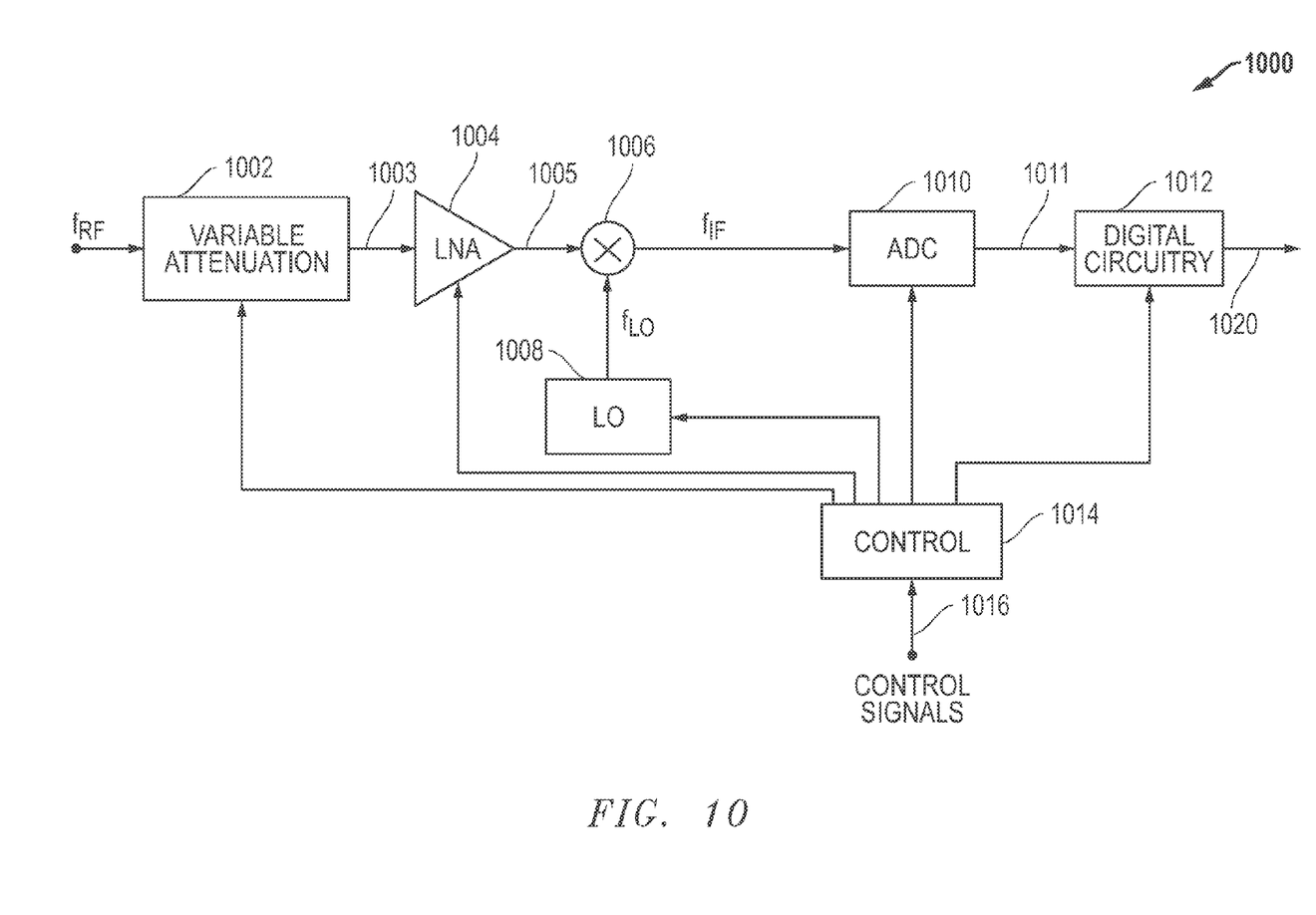
FIG. 10 illustrates an RF receiver system according to one exemplary embodiment of the disclosed systems and methods.

FIG. 10 illustrates a block diagram of an RF receiver system 1000 (e.g., television receiver system, AM/FM radio receiver system, etc.) as it may be implemented using the disclosed variable capacitive attenuation circuitry. As depicted, variable capacitive attenuation circuitry 1002 of system 1000 receives analog input signals at a radio frequency ($f_{RF}$). These analog input signals may be provided as a single-ended signal or differential pair, with the details of the remaining circuitry of system 1000 being configured accordingly as previously described herein. Variable capacitive attenuation circuitry 1002 is controlled in a manner previously described to attenuate (or not attenuate) the RF input signals as desired or needed for a given application to which receiver system 1000 is employed. Variable capacitive attenuation circuitry 1002 according produces and provides RF output signal 1003 to LNA 1004 as shown, which in turn provides amplified RF signals 1005 to a mixer 1006. The mixer 1006 also receives mixing signals ($f_{LO}$) from local oscillator (LO) circuitry 1008 and outputs signals at a down-converted intermediate frequency ($f_{IF}$), which can be, for example, a low-IF frequency or a zero-IF frequency, if desired. The down-converted signals are then digitized by analog-to-digital converter circuitry (ADC) 1010. Digital signals 1011 may then be provided to digital circuitry 1012 (e.g., digital signal processor (DSP) circuitry, a micro-controller and/or other desired digital circuitry) for further processing, e.g., digital mixing to baseband signals, amplification, demodulation, buffering, etc.

As further shown in FIG. 10, control circuitry 1014 may also be included that provides control signals to the LO circuitry 1008, the ADC 1010, the digital circuitry 1012, the LNA 1004, and the variable attenuation circuitry 1002. In this regard, control signals 1016 may be provided to the control circuitry 1014 from additional circuitry, as desired. Further, it is noted that the embodiment 1000 may be integrated on the same integrated circuit, if desired. In addition, the control signals 1016 may be provided from circuitry external to this integrated circuit, and the output signals 1020 may be provided to circuitry external to this integrated circuit, as desired.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. Variable capacitive attenuation circuitry having at least one RF signal input and an RF signal output, and comprising at least two capacitors, each of the capacitors of the circuitry being selectable within the circuitry as either a shunt capacitor between the RF signal output and an RF reference or as a series capacitor between the RF signal input and the RF signal output.

2. The circuitry of claim 1, where the capacitors of the circuitry are selectable within the circuitry between each of the following settings in response to one or more received control signals:
   a first setting in which all of the capacitors are electrically coupled as series capacitors between the RF signal input and RF signal output; and
   a second setting in which a first one of the capacitors is electrically coupled as a series capacitor between the RF signal input and the RF signal output at the same time that a second one of the capacitors is electrically coupled as a shunt capacitor between the RF signal output and the RF reference.

3. The circuitry of claim 1, where the at least two capacitors comprises three or more capacitors; and where the capacitors of the circuitry are selectable within the circuitry between each of the following settings in response to one or more received control signals:
   a first setting in which all of the capacitors are electrically coupled as series capacitors between the RF signal input and RF signal output;
   a second setting in which at least one of the capacitors is electrically coupled as a series capacitor between the RF signal input and the RF signal output at the same time that at least two other of the capacitors are electrically coupled as shunt capacitors between the RF signal output and the RF reference; and a third setting in which at least two of the capacitors are electrically coupled as a series capacitors between the RF signal input and the RF signal output at the same time that at least one other of the capacitors is electrically coupled as a shunt capacitor between the RF signal output and the RF reference.

4. The circuitry of claim 1, where the variable capacitive attenuation circuitry comprises two substantially identical variable capacitive attenuation circuits, each of the two variable capacitive attenuation circuits being configured to receive one RF input signal of the same differential RF input signal pair and to produce one RF output signal of the same differential RF output signal pair; and where each given one of the two variable capacitive attenuation circuits itself comprises:
- at least two capacitors; and
- switching circuitry coupled to each of the at least two capacitors, the switching circuitry configured to selectably electrically couple each of the capacitors as either a shunt capacitor between the RF signal output of the given variable capacitive attenuation circuit and the RF reference, or as a series capacitor between the RF signal output of the given variable capacitive attenuation circuit and one RF input signal of the given variable capacitive attenuation circuit;
- where the switching circuitry of each given one of the two variable capacitive attenuation circuits is configured to selectably control its respective variable capacitive attenuation circuit simultaneously and in substantially identical manner to the switching circuitry of the other one of the variable capacitive attenuation circuits.

5. The circuitry of claim 1, where each of the capacitors of the circuitry is selectable within the circuitry so as to selectably electrically couple each of the capacitors as either a shunt capacitor between a RF signal output and a RF reference or as a series capacitor between a RF signal input and the RF signal output in a manner such that none of the capacitors is ever placed in a condition where it is not either electrically coupled between a RF signal output and a RF reference, or electrically coupled as a series capacitor between a RF signal input and a RF signal output.

6. The circuitry of claim 1, where the circuitry is configured such that no voltage bias is applied to any of the capacitors of the circuitry.

7. The circuitry of claim 1, further comprising switching circuitry including a plurality of switching circuits; where each of the capacitors is coupled between the RF signal output and a respective one of the switching circuits; and where each of the switching circuits is coupled between a respective corresponding one of the capacitors and each of the RF signal input and the RF reference.

8. The circuitry of claim 7, where each given one of the switching circuits comprises a first switch coupled between the RF signal input and a first node of the given switching circuit, and a second switch coupled between the RF reference and the first node of the given switching circuit; where the respective corresponding one of the capacitors is coupled between the RF signal output and the first node of the given switching circuit; and where the given switching circuit is configured to receive one or more control signals to control the given switching circuit between each of the two following settings:
- a first setting in which the first switch is closed in order to electrically couple the RF signal input through the first switch to the respective corresponding one of the capacitors at the same time that the second switch is open to electrically isolate the RF signal input from the RF reference; and
- a second setting in which the first switch is open to electrically isolate the RF signal input through the first switch from the respective corresponding one of the capacitors at the same time that the second switch is closed to electrically couple the respective corresponding one of the capacitors through the second switch to the RF reference.

9. The circuitry of claim 1, where the at least one RF signal input comprises multiple separate RF signal inputs; where the capacitors of the circuitry are selectable within the circuitry so as to isolate a first one of the multiple separate RF signal inputs from all of the capacitors of the variable capacitive attenuation circuitry and at the same time to select a second one of the multiple separate RF signal inputs for input to the variable capacitive attenuation circuitry by electrically coupling at least one of the capacitors as a series capacitor between the RF signal output and the selected RF signal input; and where the capacitors of the circuitry are further selectable within the circuitry so as to selectably electrically couple each of the capacitors as either a shunt capacitor between the RF signal output and the RF reference, or as a series capacitor between the selected RF signal input and the RF signal output.

10. The circuitry of claim 9, further comprising switching circuitry including a plurality of switching circuits; where each of the capacitors is coupled between the RF signal output and a respective one of the switching circuits; where each of the switching circuits is coupled between a respective corresponding one of the capacitors and each of the multiple RF signal inputs and the RF reference; where each given one of the switching circuits comprises a first switch coupled between the first RF signal input and a first node of the given switching circuit, a second switch coupled between the second RF signal input and the first node of the given switching circuit, and a third switch coupled between the RF reference and the first node of the given switching circuit; where the respective corresponding one of the capacitors is coupled between the RF signal output and the first node of the given switching circuit; and where the given switching circuit is configured to receive one or more control signals to control the given switching circuit between each of the following settings:
- a first setting in which the first switch is closed in order to electrically couple the first RF signal input through the first switch to the respective corresponding one of the capacitors at the same time that the second switch is open to electrically isolate the second RF signal input through the second switch from the respective corresponding one of the capacitors and the third switch is open to electrically isolate the first RF signal input from the RF reference;
- a second setting in which the first switch is open to electrically isolate the first RF signal input through the first switch from the respective corresponding one of the capacitors at the same time that the second switch is closed to electrically couple through the second switch the second RF signal input to the respective corresponding one of the capacitors and the third switch is open to electrically isolate the second RF signal input from the RF reference; and
- a third setting in which the first switch is open to electrically isolate the first RF signal input through the first switch from the respective corresponding one of the capacitors at the same time that the second switch is open to electrically isolate the second RF signal input through the second switch from the respective corresponding one of the capacitors and the third switch is closed to electrically couple the respective corresponding one of the capacitors through the third switch to the RF reference.

11. A method for attenuation of RF signals, comprising:
providing variable capacitive attenuation circuitry comprising at least one RF signal input, at least two capacitors and an RF signal output, each of the capacitors of the circuitry being selectable within the circuitry as either a shunt capacitor between the RF signal output and an RF reference or as a series capacitor between the RF signal input and the RF signal output;
receiving an RF input signal at the RF signal input of the variable capacitive attenuation circuitry; and
controlling the production of an RF output signal from the RF input signal by selecting each of the capacitors as either a shunt capacitor between the RF signal output and the RF reference, or as a series capacitor between the RF signal input and the RF signal output.

12. The method of claim 11, where the variable capacitive attenuation circuitry further comprises switching circuitry coupled to each of the at least two capacitors, the switching circuitry configured to selectably electrically couple each of the capacitors as either a shunt capacitor between the RF signal output and the RF reference, or as a series capacitor between the RF signal input and the RF signal output; and where the method further comprises responding to one or more control signals by using the switching circuitry to control the production of the RF output signal from the RF input signal by selecting each of the capacitors as either a shunt capacitor between the RF signal output and the RF reference, or as a series capacitor between the RF signal input and the RF signal output.

13. The method of claim 11, where the at least two capacitors comprise three or more capacitors; and where the method further comprises responding to one or more control signals to control the production of the RF output signal from the RF input signal by changing the switching circuitry between each of the following settings:
a first setting in which all of the capacitors are electrically coupled as series capacitors between the RF signal input and RF signal output to provide the RF input signal in non-attenuated form as the RF output signal;
a second setting in which at least one of the capacitors is electrically coupled as a series capacitor between the RF signal input and the RF signal output at the same time that at least two other of the capacitors are electrically coupled as shunt capacitors between the RF signal output and the RF reference to attenuate the RF input signal by a first attenuation value to produce the RF output signal; and
a third setting in which at least two of the capacitors are electrically coupled as a series capacitors between the RF signal input and the RF signal output at the same time that at least one other of the capacitors is electrically coupled as a shunt capacitor between the RF signal output and the RF reference to attenuate the RF input signal by a second attenuation value to produce the RF output signal, the second attenuation value being different than the first attenuation value.

14. The method of claim 11, where the variable capacitive attenuation circuitry comprises multiple RF signal inputs, and where the method further comprises;

isolating all but a selected one of the multiple separate RF signal inputs from all of the capacitors of the variable capacitive attenuation circuitry;
receiving an RF input signal at the RF signal input of the variable capacitive attenuation circuitry; and
controlling the production of an RF output signal from the selected one of the RF input signals by selecting each of the capacitors as either a shunt capacitor between the RF signal output and the RF reference, or as a series capacitor between the RF signal input and the RF signal output.

15. The method of claim 11, where the variable capacitive attenuation circuitry comprises two substantially identical variable capacitive attenuation circuits, each of the two variable capacitive attenuation circuits having an RF signal input configured to receive one RF input signal of the same differential RF input signal pair; where each of the two variable capacitive attenuation circuits comprises at least two capacitors and one RF signal output of the same differential RF output signal pair; where each of the capacitors of each of the two variable capacitive attenuation circuits is selectable within its respective circuit as either a shunt capacitor between the RF signal output and the RF reference or as a series capacitor between the RF signal input and the RF signal output of the same circuit; and where the method further comprises:
receiving one RF input signal of a differential RF input signal pair at the RF signal input of each of the two variable capacitive attenuation circuits; and
controlling the production of an RF output signal from the respective RF input signal received at each given one of the two variable capacitive attenuation circuits simultaneously and in substantially identical manner to produce one RF output signal of a differential RF output signal pair by selecting each of the capacitors of the given variable capacitive attenuation circuit as either a shunt capacitor between its respective RF signal output and the RF reference, or as a series capacitor between its RF signal input and its RF signal output.

16. The method of claim 11, further comprising controlling the production of an RF output signal from a RF input signal by selecting each of the capacitors as either a shunt capacitor between a RF signal output and a RF reference, or as a series capacitor between a RF signal input and a RF signal output in a manner such that none of the capacitors is ever placed in a condition where it is not either electrically coupled between a RF signal output and a RF reference, or electrically coupled as a series capacitor between a RF signal input and a RF signal output.

17. The method of claim 11, further comprising applying no voltage bias to any of the capacitors of the circuitry.

18. The method of claim 11, further comprising:
selecting at least a first one of the at least two capacitors as a series capacitor between the RF signal input and the RF signal output, and at the same time selecting at least a second one of the capacitors as either one of a shunt capacitor between the RF signal output and the RF reference or as a series capacitor between the RF signal input and the RF signal output; and
producing an RF output signal from the RF input signal at the RF signal output by providing the RF input signal to the first and second capacitors while at the same time the first capacitor is selected as a series capacitor between the RF signal input and the RF signal output, and the second capacitor is selected as either one of a shunt capacitor between the RF signal output and the RF reference or as a series capacitor between the RF signal input and the RF signal output.

19. The method of claim 18, further comprising:

selecting the first one of the at least two capacitors as a series capacitor between the RF signal input and the RF signal output, and at the same time selecting the second one of the capacitors as a shunt capacitor between the RF signal output and the RF reference;

attenuating the RF input signal to produce the RF output signal by providing the RF input signal to the first and second capacitors of the circuitry while at the same time the first capacitor is selected as a series capacitor between the RF signal input and the RF signal output, and the second capacitor is selected as a shunt capacitor between the RF signal output and the RF reference.

20. The method of claim 18, further comprising:

selecting each one of the capacitors of the variable attenuation circuitry as a series capacitor between the RF signal input and the RF signal output; and providing the RF input signal in non-attenuated form as the RF output signal by providing the RF input signal to the capacitors of the circuitry while at the same time each of the capacitors of the variable attenuation circuitry is selected as a series capacitor between the RF signal input and the RF signal output.

* * * * *